United States Patent
Fischer

(10) Patent No.: US 9,413,145 B2
(45) Date of Patent: Aug. 9, 2016

(54) METHOD FOR PRODUCING A LOW-INDUCTION BUSBAR

(76) Inventor: Peter Fischer, Oldersbek (DE)

(*) Notice: Subject to any disclaimer, the term of this patent is extended or adjusted under 35 U.S.C. 154(b) by 383 days.

(21) Appl. No.: 14/237,057
(22) PCT Filed: Aug. 3, 2012
(86) PCT No.: PCT/DE2012/000783
§ 371 (c)(1),
(2), (4) Date: Feb. 4, 2014
(87) PCT Pub. No.: WO2013/020543
PCT Pub. Date: Feb. 14, 2013

(65) Prior Publication Data
US 2014/0173892 A1 Jun. 26, 2014

(30) Foreign Application Priority Data
Aug. 5, 2011 (DE) .................. 10 2011 109 609

(51) Int. Cl.
| H05K 13/08 | (2006.01) |
| H02B 3/00 | (2006.01) |
| H05K 3/20 | (2006.01) |
| H05K 3/28 | (2006.01) |
| H05K 7/14 | (2006.01) |
| H05K 1/02 | (2006.01) |

(52) U.S. Cl.
CPC .................. *H02B 3/00* (2013.01); *H05K 3/202* (2013.01); *H05K 3/28* (2013.01); *H05K 7/1432* (2013.01); *H05K 1/0298* (2013.01); *H05K 2201/10015* (2013.01); *H05K 2201/10272* (2013.01); *H05K 2203/1316* (2013.01); *Y10T 29/49117* (2015.01)

(58) Field of Classification Search
CPC ....... H02B 3/00; H05K 1/0298; H05K 3/202; H05K 3/28; H05K 7/1432; H05K 2201/10015; H05K 2201/10272; H05K 2203/1316
See application file for complete search history.

(56) References Cited

U.S. PATENT DOCUMENTS

| 3,225,260 | A | 12/1965 | Brochier et al. |
| 3,697,816 | A | 10/1972 | Dull |
| 5,132,896 | A * | 7/1992 | Nishizawa ............ H02M 7/003 361/707 |
| 6,008,982 | A | 12/1999 | Smith |
| 6,259,617 | B1 * | 7/2001 | Wu ........................ H02M 7/003 257/724 |
| 7,667,952 | B2 * | 2/2010 | Allain ...................... H01G 2/04 361/303 |
| 7,907,385 | B2 * | 3/2011 | Korich ...................... H01G 2/04 361/305 |
| 2002/0159238 | A1 | 10/2002 | Gross et al. |
| 2004/0004816 | A1 | 1/2004 | Yamaguchi et al. |
| 2010/0008018 | A1 * | 1/2010 | Korich ...................... H01G 2/04 361/306.1 |
| 2010/0089641 | A1 * | 4/2010 | Esmaili ................. H05K 7/1432 174/70 B |

FOREIGN PATENT DOCUMENTS

DE 3148382 6/1983

* cited by examiner

*Primary Examiner* — Carl Arbes
(74) *Attorney, Agent, or Firm* — Diederiks & Whitelaw, PLC

(57) ABSTRACT

A method for producing a low-induction busbar including providing a tray with a base and a border which projects peripherally from the base so as to form a frame and which is composed of an electrically insulating material, producing a busbar element by arranging a first busbar strips, applying a film with openings which provide access to the first busbar strips, arranging the second busbar strips, on the film, bending regions of the busbar strips forming connections making electrical contact with the capacitors through the openings, inserting the busbar element into the tray and pouring an encapsulation compound into the tray so as to surround the base of the capacitors, while leaving free the connections.

2 Claims, 1 Drawing Sheet

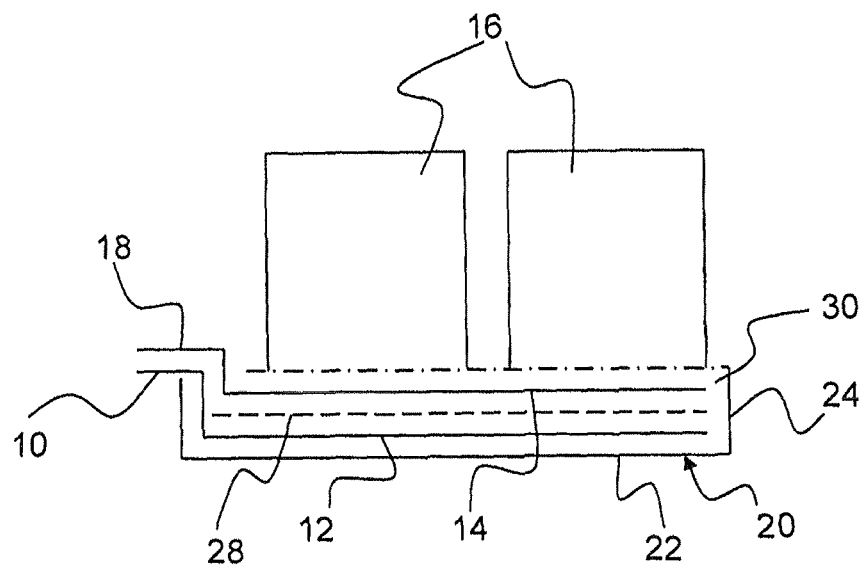

METHOD FOR PRODUCING A LOW-INDUCTION BUSBAR

CROSS-REFERENCE TO RELATED APPLICATIONS

This application represents a National Stage application of PCT/DE2012/000783 entitled "Method for Producing a Low-Induction Busbar" filed Aug. 3, 2012, pending.

BACKGROUND OF THE INVENTION

The invention relates to a method for producing a low-induction busbar having first connections, a large number of first busbar strips which are arranged in a first busbar plane, a large number of second busbar strips which are arranged in a second busbar plane, a large number of capacitors, which are electrically connected to the busbar strips, and with second connections.

Such a busbar is used for the distribution of electric power. It consists of a plurality of strips from copper or aluminium that guide the power from an input to an output.

Such bus bars serve to connect capacitors to an electric switch. To keep the busbar such that it has a low induction, the busbar strips are arranged such that the current flows through them in opposite directions so that the inductions effected by the current flow cancel each other.

In the case of such a busbar care has to be taken on the one hand that no humidity which could lead to a short circuit can penetrate into it. It is further to be insured by suitable measures that the busbar strips are insulated from each other and from the environment.

DE-12 06 043 A, DE 1934238 and DE 3148382 A1 show the production of conductor grids that are insulated from each other by films, to which diverse components, e.g. capacitors, are attached and that are then potted.

SUMMARY OF THE INVENTION

According to the invention, the object that has been named is achieved by providing a tray with a base and a border which projects peripherally from said base so as to form a frame and which is composed of an electrically insulating material, producing a busbar element by arranging the first busbar strips which form the first busbar plane, applying a film, which is provided with openings which provide access to the first busbar strips, to the first busbar strips, arranging the second busbar strips, which form the second busbar plane, on the film, bending the regions of the busbar strips which form the connections upwards, fitting and making electrical contact with the capacitors through the openings in the film on the first and on the second busbar strips, inserting the busbar element into the tray and pouring an encapsulation compound (epoxy resin) into the tray so as to surround the base of the capacitors up to below the edges of the border which forms a frame, while leaving free the connections.

Therefore the invention proposes to create a busbar by providing a tray that is provided with a base and a border which protects peripherally from said tray so as to form a frame and which is composed of an electrically insulating material.

For this purpose, at first a bus bar is produced by arranging the first busbar strips which form the first busbar plane, applying a film, which is provided with openings which provide access to the first busbar strips, to the first busbar strips, arranging the second busbar strips, which form the second busbar plane, on the film, bending the regions of the busbar strips which form the connections upwards, fitting and making electrical contact with the capacitors through openings in the film on the first and on the second busbar strips. The busbar element thus formed is then inserted into the tray. Then an encapsulation compound is poured into the tray so as to surround the base of the capacitors up to below the edges of the border which forms a frame, while leaving free the connections.

DETAILED DESCRIPTION OF THE DRAWINGS

The invention is described below using a drawing. Here, the only FIGURE illustrates a sectional representation through the bus bar that has been produced in this way.

DETAILED DESCRIPTION OF THE INVENTION

The bus bar consists of a tray 20 with a base 22 and a border 24 which projects peripherally from the base so as to form a frame, at least the base being composed of an electrically insulating material.

Into this tray a busbar element is inserted, that is formed by arranging the first busbar strips 12 which form the first busbar plane, that are provided with the input connections 10 of the busbar, the input connections 10 being sections of the busbar strips 12 that are bent upwards. Then a film is placed on the busbar strips 12 which form the first busbar plane, the film 28 being provided with openings which provide access to the first busbar strips 12. Then second busbar strips 14 which form a second busbar plane are arranged on the film 28, the busbar strips 14 being provided with connections 18 that are formed by bending a region of the second busbar strips 14 upwards. Then the capacitors 16 are attached to the first and the second busbar strips 14, possibly through the openings 16 in the film 28, connected mechanically thereto and contacted electrically.

The busbar element that has been formed in this manner is then inserted into the tray 20. Then an epoxy resin 30 is poured into the tray 20 so as to surround the base of the capacitors 16 up to below the edges of the border 24 which forms a frame, while leaving free the connections 10, 18.

In the process the epoxy resin 30 is introduced into the tray up to a level where the capacitors are surrounded by the epoxy resin thereby effecting sufficient stability.

The busbar that has been formed in this manner is protected against the ingress of humidity, it is insulated on all sides and permits a largely automatic production even in larger numbers.

The invention claimed is:
1. A method for producing a low-induction busbar comprising:
   producing a busbar element by:
      arranging a plurality of first busbar strips in a first busbar plane;
      applying a film to the plurality of first busbar strips, with the film having openings which provide access to the plurality of first busbar strips;
      arranging a plurality of second busbar strips in a second busbar plane on the film;
      bending regions of the plurality of first and second busbar strips to form connections; and
      electrically connecting a plurality of capacitors through the openings in the film to the connections of the plurality of first and second busbar strips;

inserting the busbar element into a tray having a base and a border which projects peripherally from the base so as to form a frame and which is composed of an electrically insulating material; and pouring an encapsulation compound into the tray so as to surround portions of the plurality of capacitors up to below edges of the border, while leaving free the first and second connections.

2. Method for producing a low-induction busbar having first connections, a large number of first busbar strips which are arranged in a first busbar plane, a large number of second busbar strips which are arranged in a second busbar plane, a large number of capacitors, which are electrically connected to the first and second busbar strips, and second connections, characterized by providing a tray with a base and a border which projects peripherally from said base so as to form a frame and which is composed of an electrically insulating material, producing a busbar element by arranging the first busbar strips which form the first busbar plane, applying a film, which is provided with openings which provide access to the first busbar strips, to the first busbar strips, arranging the second busbar strips, which form the second busbar plane, on the film, bending the regions of the busbar strips which form the connections upwards, fitting and making electrical contact with the capacitors through the openings in the film on the first and on the second busbar strips, inserting the busbar element into the tray and pouring an encapsulation compound into the tray so as to surround the base of the capacitors up to below the edges of the border which forms a frame, while leaving free the first and second connections.

* * * * *